(12) United States Patent
Fontaine et al.

(10) Patent No.: US 7,151,473 B2
(45) Date of Patent: Dec. 19, 2006

(54) DIGITAL DETECTION OF BLOCKERS FOR WIRELESS RECEIVER

(75) Inventors: Paul H. Fontaine, Plano, TX (US); Ahmed Mohieldin, Richardson, TX (US); Pascal Audinot, Valbonne (FR); Abdellatif Bellaouar, Richardson, TX (US); Mikael Guenais, Nice (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/203,717

(22) Filed: Aug. 15, 2005

(65) Prior Publication Data

US 2006/0055579 A1 Mar. 16, 2006

Related U.S. Application Data

(60) Provisional application No. 60/603,417, filed on Aug. 20, 2004.

(51) Int. Cl.
*H03M 1/84* (2006.01)
(52) U.S. Cl. ...................................... 341/139; 341/155
(58) Field of Classification Search ................ 341/143, 341/155, 118, 138, 139, 144
See application file for complete search history.

(56) References Cited

U.S. PATENT DOCUMENTS 5,438,460 A * 8/1995 Coker et al. .................. 360/46
6,476,745 B1 * 11/2002 Evans et al. ................ 341/139
2004/0184562 A1 * 9/2004 Wang et al. ................. 375/322
2004/0259510 A1 12/2004 Audinot et al.
2005/0070325 A1 * 3/2005 Bellaouar et al. ........ 455/550.1

OTHER PUBLICATIONS

UNKNOWN; "Demystifying Sigma-Delta ADCs"; Dallas Semiconductor Maxim; http://www.maim-ic.com/appnotes.cfm/appnote_number/1870, no date.
UNKNOWN; "Demystifying Sigma-Delta ADCs"; Dallas Semiconductor Maxim; http://www.maim-ic.com/appnotes.cfm/appnote_number/1870, Jan. 31, 2003.

* cited by examiner

*Primary Examiner*—Peguy JeanPierre
(74) *Attorney, Agent, or Firm*—Ron O. Neerings; W. James Brady, III; Frederick J. Telecky, Jr.

(57) ABSTRACT

A receiver 100 is provided. The receiver 100 comprises an in-phase analog-to-digital converter 112 operable to detect a saturation condition of the in-phase analog-to-digital converter 112 and to adjust the amplitude of a in-phase signal processed by the in-phase analog-to-digital converter 112 to remove the in-phase analog-to-digital converter 112 from the saturation condition and a in-phase digital filter 114 operable to adjust a gain applied to a digital input to the in-phase digital filter 114 from the in-phase analog-to-digital converter 112, the adjustment of the gain substantially inversely proportional to the adjustment of the amplitude of the in-phase signal processed by the in-phase analog-to-digital converter 112. In an embodiment, the receiver 100 also comprises a quadrature path that is substantially similar to the in-phase path, and the in-phase path and the quadrature path comprise a direct conversion receiver. In an embodiment, the in-phase analog-to-digital converter 112 and the in-phase digital filter 114 comprise an intermediate frequency receiver.

21 Claims, 3 Drawing Sheets

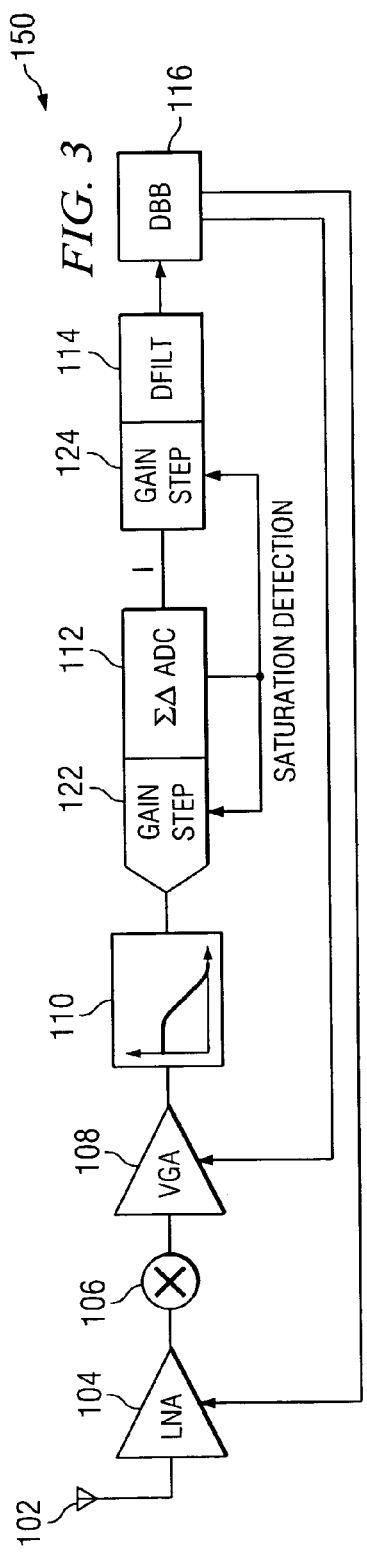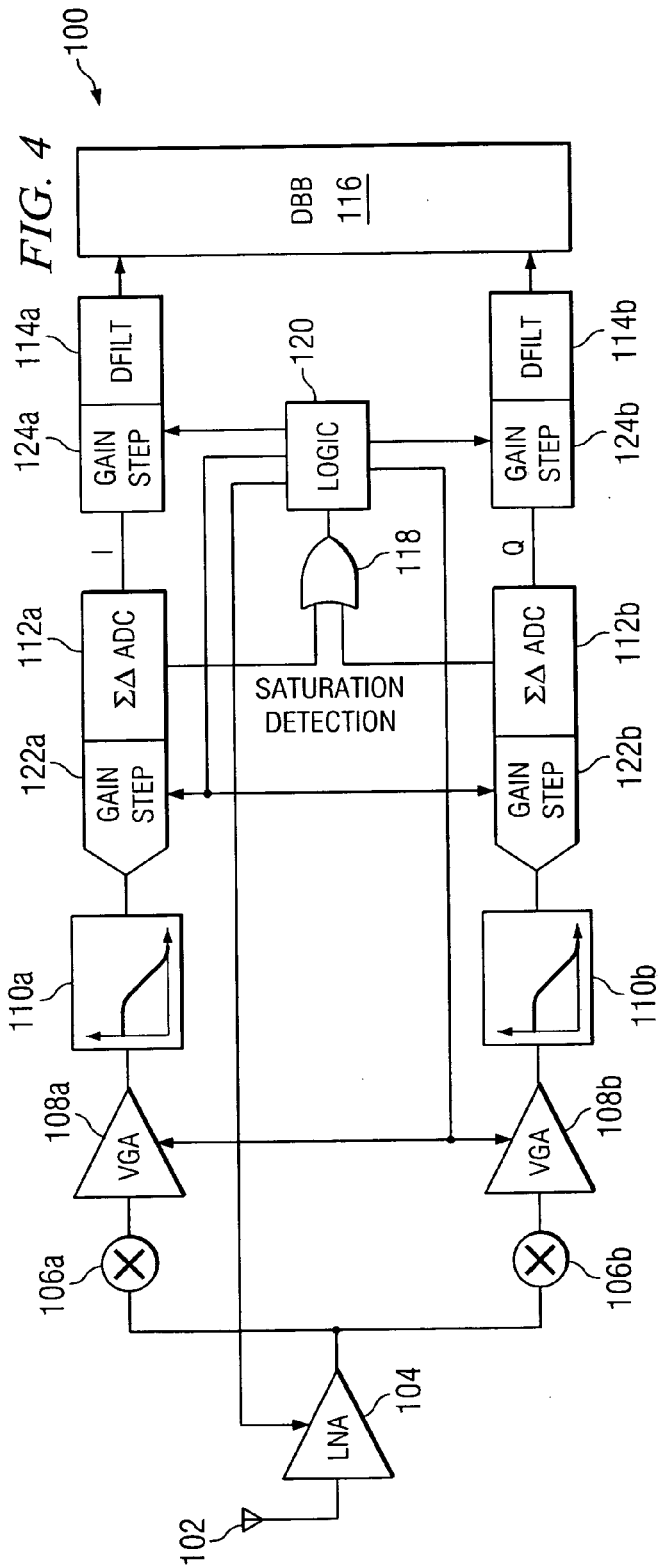

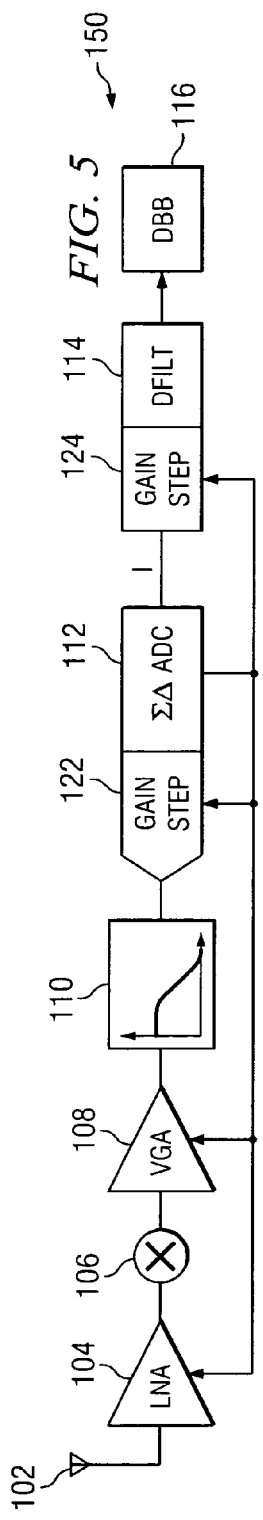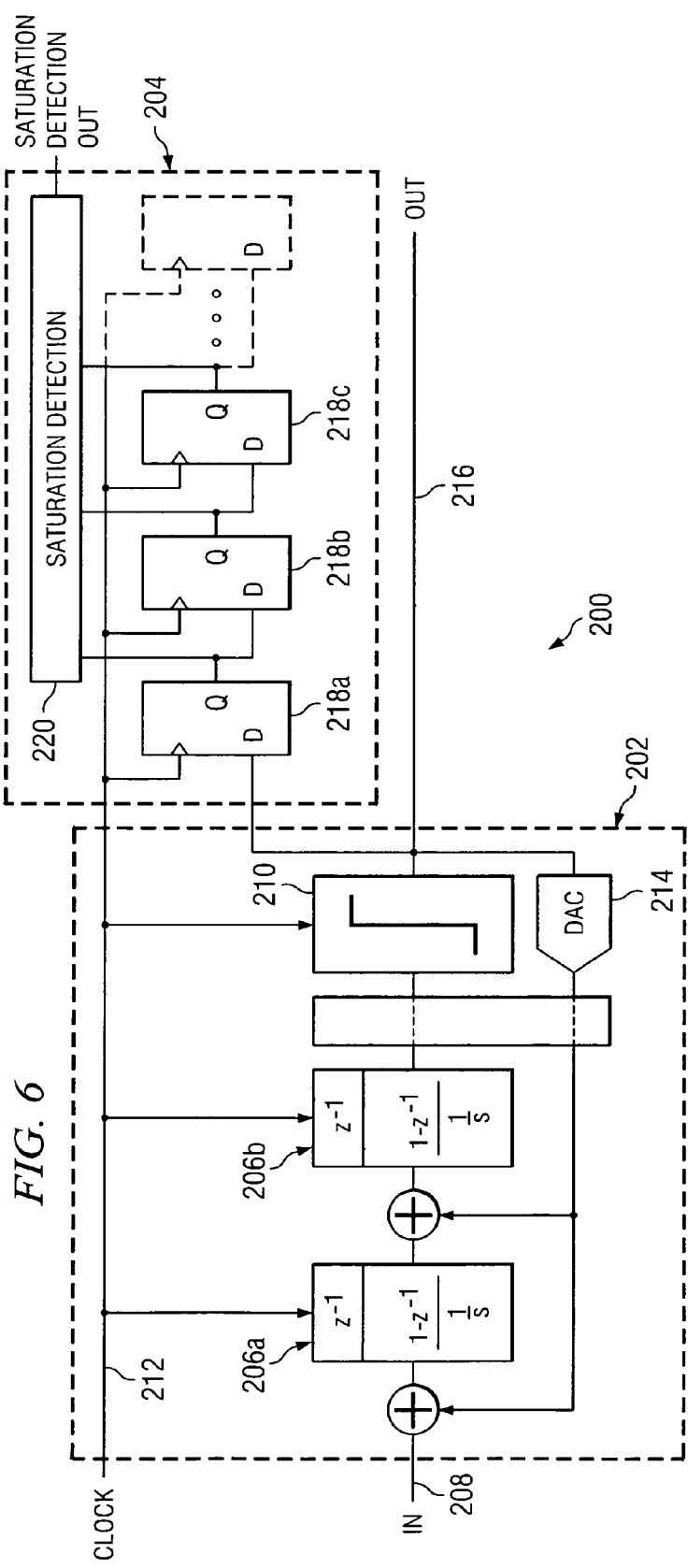

US 7,151,473 B2

DIGITAL DETECTION OF BLOCKERS FOR WIRELESS RECEIVER

CROSS-REFERENCE TO RELATED APPLICATIONS

This application claims priority to U.S. Provisional Application No. 60/603,417 filed Aug. 20, 2004, and entitled "Digital Blockers Detection for Wireless Receiver," by Abdellatif Bellaouar, et al, incorporated herein by reference for all purposes.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present disclosure is directed to communication devices, and more particularly, but not by way of limitation, to a system and digital method for detection and correction of blockers for a wireless receiver.

BACKGROUND OF THE INVENTION

Communication protocols define standardized communication procedures to enable equipment from different vendors to intercommunicate. Communication standards generally evolve constantly as new needs and more powerful electronic technology emerges. Communications circuits may be combined in one or more integrated circuits to achieve desirable price points for consumer electronics. Several communications components including filters, amplifiers, encoders, decoders, signal processing components, error correction components, and memory may be combined or integrated in a single integrated circuit or chip. Specialized chips and/or chip sets may be developed by semiconductor manufacturers to support specific communication protocols. As new communication standards or variations of standards are released, new chips and/or chips sets are designed and released for sale.

Continuous analog signals may be converted to a sequence of discrete digital values by an analog-to-digital converter (ADC). The ADC may represent the value of an analog signal at a specific point in time, which may be referred to as a sample of the analog signal, by a finite number of possible values. To avoid aliasing, an analog signal is often low-pass filtered to substantially eliminate unwanted higher frequencies. The low-pass filtered signal may then be processed or sampled periodically at a frequency that is two times the cut-off frequency of the low-pass filter and the samples converted to a digital value. The resultant digital values may then be processed by a variety of digital components including digital filters, microprocessors, micro controllers, digital signal processors (DSPs), field programmable gate arrays (FPGAs), application specific integrated circuits (ASICs), and others.

SUMMARY OF THE INVENTION

A receiver is provided. The receiver comprises an in-phase analog-to-digital converter operable to detect a saturation condition of the in-phase analog-to-digital converter and to adjust the amplitude of a in-phase signal processed by the in-phase analog-to-digital converter to remove the in-phase analog-to-digital converter from the saturation condition and a in-phase digital filter operable to adjust a gain applied to a digital input to the in-phase digital filter from the in-phase analog-to-digital converter, the adjustment of the gain substantially inversely proportional to the adjustment of the amplitude of the in-phase signal processed by the in-phase analog-to-digital converter. In an embodiment, the receiver also comprises a quadrature path that is substantially similar to the in-phase path. In an embodiment, the in-phase analog-to-digital converter and the in-phase digital filter comprise an intermediate frequency receiver.

A method of receiving a signal is also provided. The method comprises oversampling an input analog signal to produce a series of samples, converting the samples to digital values, detecting saturation of the converted samples by observing a consecutive sequence of range limited digital values, outputting a selection of the digital values, and adjusting the amplitude of the input analog signal based on the detecting.

An analog-to-digital converter is also provided. The analog-to-digital converter comprises a converter stage operable to generate a digital indication of an amplitude of an analog signal at a periodic rate, the converter stage operable to output a selection of the digital indication, a gain stage operable to adjust the amplitude of the analog signal based on a control input, and a saturation detector stage operable to determine, based on the digital indication, that the converter stage is saturated by the amplitude of the analog signal and to output an indication of the saturation condition.

These and other features and advantages will be more clearly understood from the following detailed description taken in conjunction with the accompanying drawings and claims.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

FIG. 3 is a block diagram of an intermediate frequency radio receiver according to an embodiment of the present disclosure.

FIG. 4 is a block diagram of the direct conversion radio receiver according to another embodiment of the present disclosure.

FIG. 5 is a block diagram of the intermediate frequency radio receiver according to another embodiment of the present disclosure.

FIG. 6 is a block diagram of an analog-to-digital converter with saturation detection according to an embodiment of the present disclosure.

DETAILED DESCRIPTION OF THE PREFERRED EMBODIMENTS

It should be understood at the outset that although an exemplary implementation of one embodiment of the present disclosure is illustrated below, the present system may be implemented using any number of techniques, whether currently known or in existence. The present disclosure should in no way be limited to the exemplary implementations, drawings, and techniques illustrated below, including the exemplary design and implementation illustrated and described herein.

Figure 1:
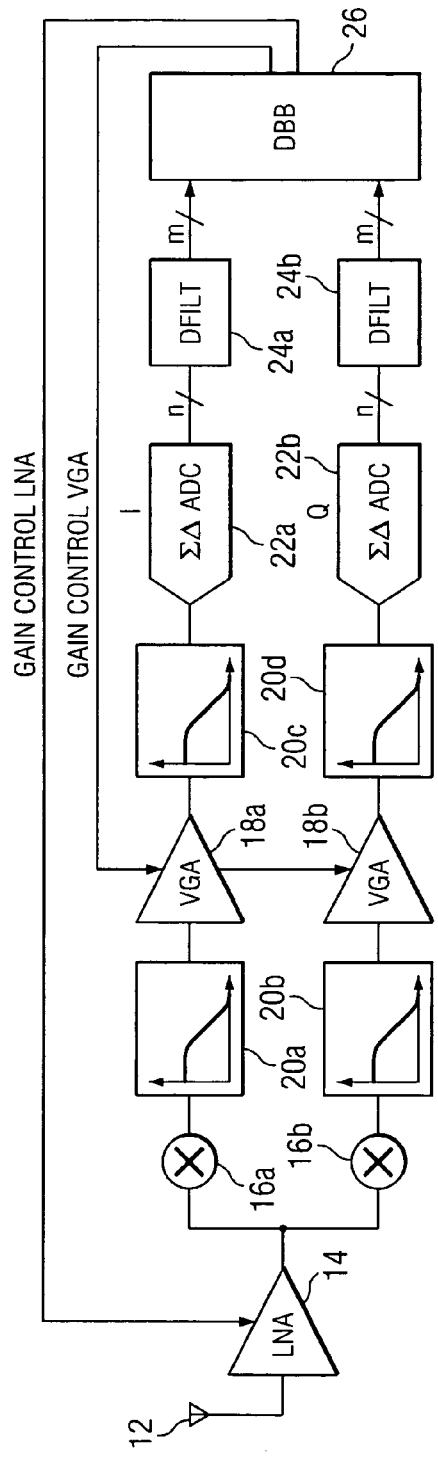
FIG. 1 is a block diagram of a prior art radio receiver.

Turning to FIG. 1, a prior art system 10 is depicted. The prior art system 10 is a portion of an analog front-end and a digital baseband. An antenna 12 receives a wireless signal that is amplified by a low noise amplifier (LNA) 14. In an embodiment, an in-phase component of the wireless signal is shifted to baseband by an in-phase mixer 16a and the quadrature component of the wireless signal is shifted to baseband by a quadrature mixer 16b. The output of the in-phase mixer 16a is amplified by an in-phase variable gain amplifier (VGA) 18a. The output of the in-phase VGA 18a is low-pass filtered by an in-phase low-pass filter 20a. The output of the in-phase low-pass filter 20a, which is a continuous, analog signal, is converted to a sequence of digital values by an in-phase analog-to-digital converter (ADC) 22a. The in-phase ADC 22a outputs the sequence of digital values to an in-phase digital filter 24a. The output of the in-phase digital filter 24a is provided to a digital baseband 26 for further processing. The quadrature component of the wireless signal is processed in a similar way by a quadrature VGA 18a, a quadrature low-pass filter 20b, a quadrature ADC 22b, and a quadrature digital filter 24b.

Figure 2:
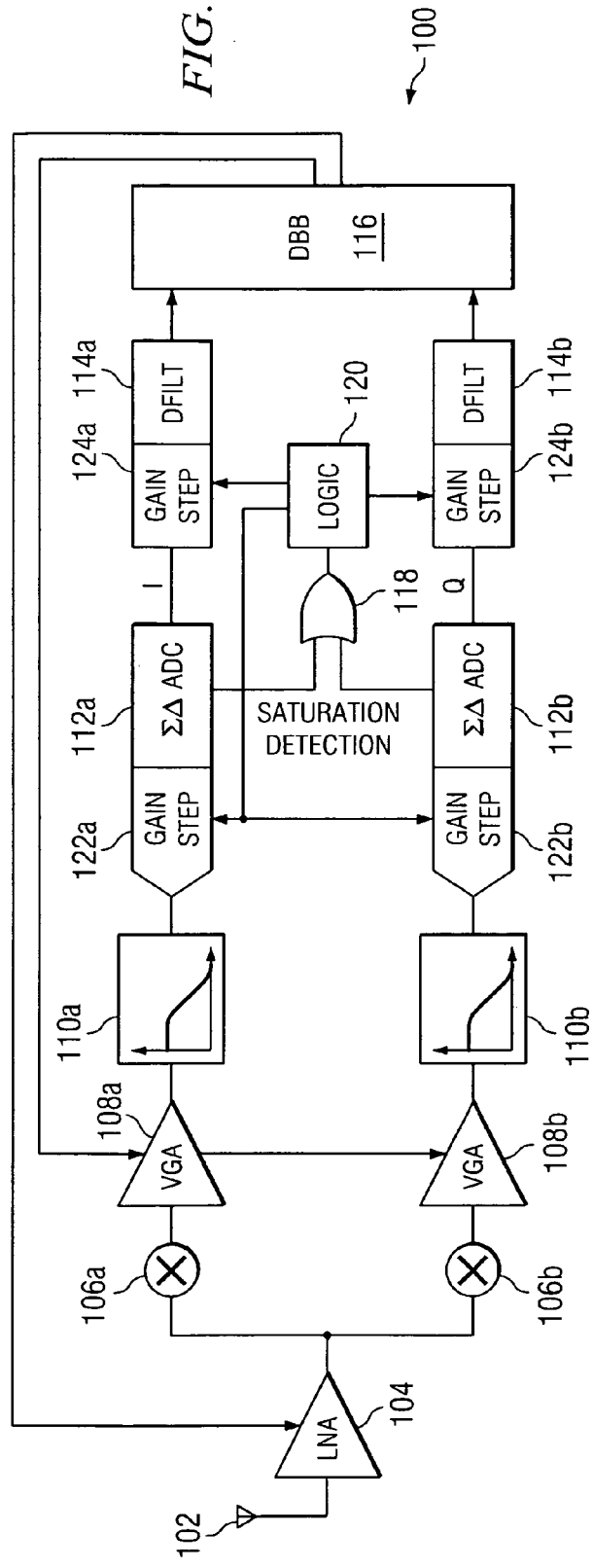
FIG. 2 is a block diagram of a direct conversion radio receiver according to an embodiment of the present disclosure.

In the prior art system 10, the receive chain is controlled by the digital baseband 26 based on the power of the signal as estimated by the digital baseband 26. It is preferable that the prior art system 10 handle the dynamic of a minimum useful signal and a maximum out-of-band interference without saturation. To meet this performance preference, substantial filtering was employed to remove out-of-band interference. The gains of amplifiers, for example the LNA 14 and the VGAs 18, are adjusted to try to maintain the ADC 22 in unsaturated condition. When the ADC 22 goes into saturation, however, the group delay of the digital filter 24 is typically eight symbols, eight symbols are corrupted before the digital baseband 26 detects and corrects the saturation condition, and another eight corrupted symbols are already in queue which cannot be corrected, thus resulting in a loss of at least sixteen symbols when saturation occurs. This may result in an unacceptable bit error rate (BER). typically leads to a loss of at least sixteen symbols as a result of corruption Turning to FIG. 2, a system 100 is depicted. The system 100 is a portion of an analog front-end and a digital baseband. An antenna 102 receives a wireless signal that is amplified by a low noise amplifier (LNA) 104. In an embodiment, an in-phase component of the wireless signal is shifted to baseband by an in-phase mixer 106a and the quadrature component of the wireless signal is shifted to baseband by a quadrature mixer 106b. The output of the in-phase mixer 106a is amplified by an in-phase variable gain amplifier (VGA) 108a. The output of the in-phase VGA 108a is low-pass filtered by an in-phase low-pass filter 110a. The output of the in-phase low-pass filter 110a, which is a continuous, analog signal, is converted to a sequence of digital values by an in-phase analog-to-digital converter (ADC) 112a. The in-phase ADC 112a outputs the sequence of digital values to an in-phase digital filter 114a. The output of the in-phase digital filter 114a is provided to a digital baseband 116 for further processing. The quadrature component of the wireless signal is processed in a similar way by a quadrature VGA 108a, a quadrature low-pass filter 110b, a quadrature ADC 112b, and a quadrature digital filter 114b. The system 100 may be referred to as a direct conversion receiver because it mixes the RF signal down and processes the down converted signal at a baseband frequency.

Turning now to FIG. 3, a system 150 is depicted. The system 150 is substantially similar to the system 100, except that in system 150 the RF signal is mixed down and processed at an intermediate frequency. The digital baseband will implement the final in-phase and quadrature mixing and further processing. The system 150 may be referred to as an intermediate frequency receiver.

Returning to FIG. 2, if the amplitude of the output of the low-pass filter 110 is too great, the ADC 112 will saturate. In the saturated condition, increases in the amplitude of the wireless signal are not converted to an increased digital value by the ADC 112. The in-phase ADC 112a and the quadrature ADC 112b each have internal circuitry to detect saturation and output a signal to an OR logic gate 118. The output of the OR logic gate 118 feeds into a control logic component 120. When a saturation condition is detected by the in-phase ADC 112a or by the quadrature ADC 112b, the control logic component 120 directs each ADC 112 to reduce the amplitude of the analog signal present on the inputs of each ADC 112 and directs each digital filter 114 to increase the weight assigned to the input digital values after a time delay. This time delay is set equal to a delay associated with the processing of the ADC 112 in order to minimize the perturbations associated with these gain adjustments. In an embodiment, the control logic component 120 develops a control signal that is provided to an in-phase ADC gain step 122a, and a quadrature ADC gain step 122b. In other embodiments, the control signals may be distributed differently. In system 150, the embodiment of an intermediate frequency receiver depicted in FIG. 3, the ADC 112 may perform the function of the OR logic gate 118 and the control logic component 120.

The in-phase ADC gain step 122a is provided by the in-phase ADC 112a to control the amplitude of the analog signal input to the in-phase ADC 112a, and the quadrature ADC gain step 122b is provided by the quadrature ADC 112b to control the amplitude of the analog signal input to the quadrature ADC 112b. In an embodiment, the ADC gain step 122 may be provided by decreasing the sampling capacitor (sampled time SD), the input transconductance (continuous time ADC), or increasing the reference value of the ADC 112. In an embodiment, the ADC gain step 122 may be provided by a component distinct from the ADC 112 located between the low-pass filter 110 and the ADC 112. An in-phase digital filter gain step 124a is provided by the in-phase digital filter 114a to control the weight assigned to the digital values input to the in-phase digital filter 114a, and a quadrature digital filter gain step 124b is provided by the quadrature digital filter 114b to control the weight assigned to the digital values input to the quadrature digital filter 114b. The digital gain step 124 may be accomplished by shifting values right or left. Note that the gain adjustment in the digital filter 114 is substantially inversely proportional to the gain adjustment in the ADC 112.

The ADC gain steps 122 may be continuously variable while the digital gain steps 124 may only take a finite number of gain values because of the digital nature of the signal involved. In theory, problems due to a mismatch, where here 'mismatch' refers to variance from a perfectly inverse proportionality, between the gain step in the ADC 112 versus the gain step in the digital filter 114 could develop, but in practice it is found that if the mismatch is less than 1 dB, the bit error rate (BER) of a receiver incorporating the system 100 is not increased. Circuitry that keeps gain mismatch below 1 dB is feasible in current technology.

In earlier systems, only the saturation due to inband signals could be detected by the digital baseband 116 only after the signal latency of the digital filter 114 was traversed. In practice, as many as sixteen symbols may be corrupted by the saturation before correction procedures controlled by the digital baseband 116 brought the ADC 112 out of saturation. Also, saturation of the ADC 112 from outband signals (interferers or blockers) could not be detected because the outband components are removed by the filter 114. Additionally, saturation detection may place a heavy processing burden on the digital baseband 116. In the present system 100, the ADC 112 detects the saturation condition at the oversampled rate, and correction procedures take place before two symbols are corrupted. In some cases, saturation can be detected and corrected before any symbol corruption occurs. In an embodiment, the digital baseband 116 adjusts the gains of the LNA 104 and the VGAs 108 based on the received signal strength indicator (RSSI) of the inband signal. In an alternate embodiment of the system 100 depicted in FIG. 4, the gains of the LNA 104 and the VGAs 108 may be controlled directly by the control logic component 120, as the saturation detection does not discriminate between inband and outband signals. In an alternate embodiment of the system 150 depicted in FIG. 5, the gains of the LNA 104 and the VGA 108 may be controlled directly by the ADC 112.

Turning now to FIG. 6, a sigma-delta ADC (ΣΔ ADC) with digital saturation detection 200 is depicted. The ΣΔ ADC with saturation detection 200 may be employed in the role of the ADC 112 described above with reference to FIG. 1 through FIG. 6. The ΣΔ ADC with saturation detection 200 includes a conventional ΣΔ ADC section 202 and a saturation detection section 204. In an embodiment, the conventional ΣΔ ADC section 202 includes one or more integration components 206. In an embodiment, more than two integration components 206 may be employed, indicated by the three dots. The integration components 206 may be continuous time or discrete time components. The analog input signal 208 to be converted to a digital or discrete value is fed into a first integration component 206a. The outputs of the integration components 206 combine to feed into a comparator 210. In an embodiment, the comparator 210 compares the output from the integration components 206 to a reference voltage.

The comparator 210 generates a comparator output 216. In an embodiment, the comparator 210 outputs a digital high value on the comparator output 216 when the output from the integration components 206 exceeds the reference voltage and outputs a digital low on the comparator output 216 when the reference voltage exceeds the output from the integration components 206. The comparator 210 receives a clock signal 212 that controls when the comparator 210 outputs. Clocking the comparator 210 may be referred to as sampling the analog input signal 208. In an embodiment, the single bit output of the comparator 210 tracks the change of the analog input signal 208. In other embodiments, two bit outputs or more may be employed.

The clock signal 212 drives the comparator 210 at several times the Nyquist frequency of the useful analog input signal 208, which may be referred to as oversampling. The Nyquist frequency is twice the highest frequency content of a signal. In an embodiment, the clock signal 212 may operate at from ten times to four hundred times the highest frequency content of the analog input signal 208. In a wideband code division multiple access (W-CDMA) wireless receiver, the clock signal 212 may operate at about 120 MHz. In a global system for mobile communications system (GSM) edge wireless receiver, the clock signal 212 may operate at about 26 MHz. A digital to analog converter 214 provides a feedback reference into the integration components 206.

The comparator output 216 is then filtered by the digital filter 114 and decimated to provide selected converted values to the digital baseband 116. For example, about one of twenty-four converted values may be selected for output to digital components in a W-CDMA wireless receiver embodiment. In another example, about one of one hundred and thirty converted values may be selected for output to digital components in a GSM edge wireless receiver embodiment. In an embodiment, the relative proportion of high and low digital values provided as selected converted values represents the ratio of the analog input signal 208 to the reference voltage.

Generally, the functions and structures of the conventional ΣΔ ADC section 202 are well known to those skilled in the art. While an exemplary embodiment of the conventional ΣΔ ADC section 202 is discussed above, alternative embodiments are known and contemplated by the present disclosure. ΣΔ modulation is widely used for high performance analog-to-digital conversion of narrow band signals. Using a high oversampling ratio (OSR) and feedback, the quantization noise of a coarse FLASH converter is shaped such that the in-band signal-to-quantization-noise ratio (SQNR) is increased. There are two main circuit implementations for ΣΔ ADCs: sampled-time and continuous-time. Sampled-time ΣΔ ADC integrators have stringent settling accuracy requirements, whereas continuous-time ΣΔ ADC implementations can operate at a lower gain-bandwidth (GBW) product for the same level of performance, allowing substantial power saving. Moreover, continuous-time ΣΔ ADC implementations may reduce signal aliasing and noise folding due to sampling since the only sampler is located in the comparator, inside the quantization noise shaping loop. Thus, these errors are shaped by the high gain of the continuous-time loop filter. Also the continuous-time approach gets rid of the problematic need of high-swing linear switches in deep submicron process. On the other hand, high sensitivity to clock jitter and excess loop delay may be disadvantages in continuous-time SD modulators.

The saturation detection section 204 receives the clock signal 212 and the comparator output 216. The saturation detection section 204 comprises a plurality of memory storage elements 218 and a saturation detector 220. In general, a number N memory storage elements 218 may be employed, where N depends upon the structure of the conventional ΣΔ ADC section 202. Typically N is around eight.

In an embodiment, the memory storage elements 218 may be flip-flops, for example D-type flip-flops. The memory storage elements 218 are arranged in a series so that the comparator output 216 is fed as input to a first storage element 218a, the output of the first storage element 218a is fed as input to a second storage element 218b, the output of the second storage element 218b is fed as input to a third storage element 218c, and similarly to other memory storage elements 218. The clock signal 212 is distributed in common to each of the memory storage elements 218, and the memory storage elements 218 write and store the value or values present on their inputs in response to the clock signal 212. The N memory storage elements 218 store N sequential values of the comparator output 216.

The outputs of each of the memory storage elements 218 are provided to the saturation detector 220. The saturation detector 220 determines that the conventional ΣΔ ADC section 202 is in a saturation condition when all maximum digital values or all minimum digital values are present on the outputs of the N memory storage elements 218. The saturation detector 220 outputs an indication of the saturation condition, for example to the OR gate 118. In an embodiment, the saturation detector 220 outputs an indication of a high saturation condition on a first output line and a separate indication of a low saturation condition on a second output line.

Because the saturation detector 220 responds to the N most recent outputs from the conventional ΣΔ ADC section 202, the saturation condition may be detected and corrected before one of the selected converted values is output. In most cases, the saturation condition may be detected and corrected before two selected converted value are output having a corrupted value.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein, but may be modified within the scope of the appended claims along with their full scope of equivalents. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other items shown or discussed as directly coupled or communicating with each other may be coupled through some interface or device, such that the items may no longer be considered directly coupled to each other but may still be indirectly coupled and in communication, whether electrically, mechanically, or otherwise with one another. Other examples of changes, substitutions, and alterations are ascertainable by one skilled in the art and could be made without departing from the spirit and scope disclosed herein.

What is claimed is:

1. A receiver, comprising:
    an in-phase analog-to-digital converter operable to detect a saturation condition of the in-phase analog-to-digital converter and to adjust the amplitude of an in-phase signal processed by the in-phase analog-to-digital converter to remove the in-phase analog-to-digital converter from the saturation condition; and
    an in-phase digital filter operable to adjust a gain applied to a digital input to the in-phase digital filter from the in-phase analog-to-digital converter, the adjustment of the gain substantially inversely proportional to the adjustment of the amplitude of the in-phase signal processed by the in-phase analog-to-digital converter.

2. The receiver of claim 1, wherein the in-phase analog-to-digital converter oversamples the in-phase signal at a rate in a range of about ten times to about four hundred times a highest frequency content of the in-phase signal.

3. The receiver of claim 1, wherein the in-phase analog-to-digital converter is a sigma-delta analog-to-digital converter.

4. The receiver of claim 3, wherein the in-phase analog-to-digital converter includes
    a comparator operable to generate a sequence of one values and zero values based in part on the in-phase signal;
    a series of N number of storage elements operable to store a previous N values output by the comparator; and
    a saturation detector operable to read from the N number of storage elements and to evaluate a condition of all one values stored in the N number of storage elements as an over-voltage saturation condition, the saturation detector further operable to evaluate a condition of all zero values stored in the N number of storage elements as an under-voltage saturation condition.

5. The receiver of claim 4, wherein N is a number greater than six.

6. The receiver of claim 4, wherein the N number of storage elements are further defined as N number of flip-flops.

7. The receiver of claim 1, further including:
    one or more amplifiers operable to increase the amplitude of a signal input to the in-phase analog-to-digital converter based on a first control input, wherein the in-phase digital filter is further operable to provide the first control input based on the adjustment of the amplitude of the in-phase signal processed by the in-phase analog-to-digital converter.

8. The receiver of claim 1, further including:
    a quadrature analog-to-digital converter operable to detect a saturation condition of the quadrature analog-to-digital converter and to adjust the amplitude of a quadrature signal processed by the quadrature analog-to-digital converter, the adjustment of the amplitude of the quadrature signal based on the detection of the saturation condition of the quadrature analog-to-digital converter and based on the detection of the saturation condition of the in-phase analog-to-digital converter; and
    a quadrature digital filter operable to adjust a gain applied to a digital input to the quadrature digital filter from the quadrature analog-to-digital converter, the adjustment substantially inversely proportional to the adjustment of the amplitude of the quadrature signal processed by the quadrature analog-to-digital converter and of the amplitude of the in-phase signal processed by the in-phase analog-to-digital converter wherein the in-phase analog-to-digital converter adjusts the amplitude of the in-phase signal further based on the detection of the saturation condition of the quadrature analog-to-digital converter and wherein the in-phase digital filter adjusts the gain applied to the digital input to the in-phase digital filter further based on the adjustment of the amplitude of the quadrature signal processed by the quadrature analog-to-digital converter.

9. The receiver of claim 1, wherein the adjustment applied to the digital input to the in-phase digital filter varies from inverse proportionality with the adjustment of the amplitude of the in-phase signal processed by the in-phase analog-to-digital converter by less than about 1 dB.

10. The receiver of claim 1, wherein the in-phase signal is based on a communication protocol selected from the group consisting of a wideband code division multiple access protocol and a global system for mobile communications edge protocol.

11. The receiver of claim 1, wherein the in-phase analog-to-digital converter and the in-phase digital filter comprise an intermediate frequency receiver.

12. A method of receiving a signal, comprising:
oversampling an input analog signal to produce a series of samples;
converting the samples to digital values;
detecting saturation of the converted samples by observing a consecutive sequence of range limited digital values;
outputting a selection of the digital values;
adjusting the amplitude of the input analog signal based on the detecting;
digitally filtering the digital values; and
controlling a weight assigned to the digital values based on the detecting of saturation.

13. The method of claim 12, further including adjusting the amplitude of the selection of the digital values before digitally filtering the selection of the digital values, the amplitude adjusted substantially inversely proportional to the adjusting the amplitude of the input analog signal.

14. The method of claim 12, wherein the oversampling occurs at a rate in a range of from about ten times to about four hundred times the highest frequency content of the input analog signal.

15. The method of claim 12, wherein the input analog signal is based on a communication protocol selected from the group consisting of a wideband code division multiple access protocol and a global system for mobile communications edge protocol.

16. A method of receiving a signal, comprising:
oversampling an input analog signal to produce a series of samples;
converting the samples to digital values;
detecting saturation of the converted samples by observing a consecutive sequence of range limited digital values;
outputting a selection of the digital values;
adjusting the amplitude of the input analog signal based on the detecting; and
wherein detecting the saturation and adjusting the amplitude of the input analog signal occurs before outputting two selections of the digital values.

17. An analog-to-digital converter (ADC), comprising:
a converter stage operable to generate a digital indication of an amplitude of an analog signal at a periodic rate, the converter stage operable to output a selection of the digital indication;
a gain stage operable to adjust the amplitude of the analog signal based on a control input;
a saturation detector stage operable to determine, based on the digital indication, that the converter stage is saturated by the amplitude of the analog signal and to output an indication of the saturation condition; and
the gain stage operable to adjust the amplitude by adjusting an element selected from the group consisting of a sampling capacitor, transconductance and reference value of the ADC.

18. The analog-to-digital converter of claim 17, wherein the periodic rate is in a range of from about ten times to about four hundred times the highest frequency content of the analog signal.

19. The analog-to-digital converter of claim 17, wherein the analog-to-digital converter is a sigma delta analog-to-digital converter.

20. An analog-to-digital converter, comprising:
a converter stage operable to generate a digital indication of an amplitude of an analog signal at a periodic rate, the converter stage operable to output a selection of the digital indication;
a gain stage operable to adjust the amplitude of the analog signal based on a control input;
a saturation detector stage operable to determine, based on the digital indication, that the converter stage is saturated by the amplitude of the analog signal and to output an indication of the saturation condition; and
wherein the saturation detector stage stores N values based on the digital indications generated by the converter stage and determines that a saturation condition exists when each of the N values are one of maximum values and minimum values.

21. The analog-to-digital converter of claim 20, wherein the analog-to-digital converter is a sigma delta analog-to-digital converter and N is greater than six.

* * * * *